(12) United States Patent
Chen et al.

(10) Patent No.: US 7,004,642 B2
(45) Date of Patent: Feb. 28, 2006

(54) OPTO-ELECTRICAL MODULE PACKAGING

(75) Inventors: Wen-Yan Chen, Hsinchu (TW); Rong-Chang Feng, Hsinchu (TW); Chun-Kai Liu, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 314 days.

(21) Appl. No.: 10/361,686

(22) Filed: Feb. 11, 2003

(65) Prior Publication Data
US 2003/0161367 A1 Aug. 28, 2003

(30) Foreign Application Priority Data
Feb. 26, 2002 (TW) ................................. 91202246 U

(51) Int. Cl.
*G02B 6/26* (2006.01)

(52) U.S. Cl. ............................ 385/88; 385/31; 385/52
(58) Field of Classification Search ................. 385/52, 385/88, 16, 31, 89
See application file for complete search history.

(56) References Cited
U.S. PATENT DOCUMENTS

| | | | |
|---|---|---|---|
| 5,123,066 A | | 6/1992 | Acarlar |
| 5,506,445 A | * | 4/1996 | Rosenberg ................. 257/666 |
| 6,031,856 A | | 2/2000 | Wu et al. |
| 6,377,742 B1 | * | 4/2002 | Go ............................. 385/134 |
| 6,726,375 B1 | * | 4/2004 | Kato et al. .................... 385/88 |
| 2003/0138989 A1 | * | 7/2003 | Duesman et al. ............. 438/65 |
| 2005/0036732 A1 | * | 2/2005 | Kropp ........................ 385/16 |

* cited by examiner

*Primary Examiner*—Brian Healy
*Assistant Examiner*—Eric Wong
(74) *Attorney, Agent, or Firm*—Birch, Stewart, Kolasch & Birch, LLP

(57) ABSTRACT

The opto-electrical module packaging installs opto-electrical devices on a conductive leadframe to form an opto-electrical module. The opto-electrical module is then packaged using a molding packaging means, forming a transparent plastic base. The transparent plastic base is installed with a convergent lens to focus light. The leadframe has a plurality of pins and is mounted on the circuit board by soldering. This forms a packaging structure without bare pins exposed to the environment. In addition, the leadframe has a precision alignment structure extending outward as the alignment mechanism when assembled with a fiber connector. The precision packaging procedure provides a precision alignment of the converging lens and the opto-electrical devices at the same time.

18 Claims, 6 Drawing Sheets

OPTO-ELECTRICAL MODULE PACKAGING

This nonprovisional application claims priority under 35 U.S.C. § 119(a) on Patent Application No. 091202246 filed in TAIWAN, R.O.C. on Feb. 26, 2002, which is herein incorporated by reference.

BACKGROUND OF THE INVENTION

1. Field of Invention

The invention relates to an opto-electrical packaging and, in particular, to an opto-electrical packaging technique that utilizes an alignment mechanism and a molding packaging means to increase the yield and to lower the cost.

2. Related Art

In accord with the high-speed broadband communication trend in the future, the optical communication industry that uses light as the communication medium prospers in recent years. Fiber products for optical communications also become more important. High-speed transmission systems using optic fibers as the media have to have high-quality transceiver module in support in order to satisfy users' needs. The main elements in an optical transceiver module include a light-emitting device, a photo detector, a converging lens, a control circuit board, and fiber connectors. The packaging of the normal optical transceiver modules requires an active alignment method to align the opto-electrical devices in order to have precision alignment between the opto-electrical devices and the converging lens. Currently, such an alignment task is performed manually. This requires more time and manpower, while the yield cannot be easily increased. Therefore, this method is not ideal for mass production. Consequently, how to develop a new packaging technique for optical transceiver modules in such a way that opto-electrical devices are precisely aligned with a higher yield but a lower cost has been an important subject in the optical communication industry.

Traditionally, most optical transceiver modules adopt an edge-emitting laser light-emitting diode (LED) as their light-emitting device. The laser beam is emitted from the edge surface of the chip. In recent years, the development in the vertical cavity surface emitting laser (VCSEL) has greatly increased the functions of the optical transceiver module. In comparison with the edge-emitting laser, the VCSEL has a higher output power, a smaller spreading angle, and a rounder beam output. Besides, the VCSEL can provide wafer-grade tests for individual devices. Therefore, the VCSEL has wider applications and has received great attention in using it as the light source of the optical transceiver module.

The packaging structure of a VCSEL optical transceiver module in the prior art usually uses a metal case, as disclosed in the U.S. Pat. No. 6,031,856. The design of the packaging structure is to install the VCSEL on a substrate. A metal case is used to package the module. The electrical signals are output from the metal pins underneath the package. A converging lens is installed at where light is emitted. Such a design requires active alignments between the chip and the lens. Therefore, the material cost is higher and the packaging size is larger.

To increase the density of the assembled module and to lower the cost, a molding packaging means is developed for integrated circuit (IC) device packaging. For example, the U.S. Pat. No. 5,506,445 uses a leadframe to install the VCSEL and a transparent plastic material to package it. A lens for converging light is formed directly from the plastic material. In the U.S. Pat. No. 5,123,066, however, the leadframe is used for electrical communications. It also uses a plastic material for packaging. After packaging, the pins of the leadframe are connected to an external conductive circuit. Using the molding packaging means can lower the packaging cost and thus becomes the mainstream these days. Nevertheless, the molding packaging means currently used has to extend pins from the leadframe to outside in order to output electrical signals. The packaging size thus increases. Moreover, the current molding packaging means does not provide a precision alignment mechanism for the opto-electrical devices, lenses, and optic fiber connectors. As a result, the yield of opto-electrical packaging cannot be significantly increased.

SUMMARY OF THE INVENTION

In view of the foregoing, an objective of the invention is to provide an opto-electrical module packaging technique, which integrates the no-pin packaging and the molding packaging means to lower the cost and to increase the yield.

The invention provides an opto-electrical packaging includes an opto-electrical module and a transparent plastic base. The opto-electrical module consists of more than one opto-electrical device. Its leadframe has several pins that are mounted on a circuit board by soldering to provide electrical communications. The leadframe further has a precision alignment structure extending outward for aligning the opto-electrical module with the optic fiber connector. The transparent plastic base is used to package the opto-electrical module. It is installed with a converging lens for focusing light. The converging lens is aligned with the opto-electrical devices using the precision packaging procedure of the leadframe, which could be chip mounting or chip bonding.

The opto-electrical device installed on the leadframe in the invention can be one of the light-emitting device, the photo detector, the arrayed light-emitting device, and the arrayed photo detector. Moreover, the leadframe can contain several opto-electrical devices. Alternatively, two sets of leadframes can be packaged into one packaging so as to provide optical output and detection simultaneously. The opto-electrical device can be installed on the leadframe by bonding or chip mounting. The precision alignment structure extended outward from the leadframe can be a positioning device such as a through hole or a pin. The transparent plastic base is formed by filing a transparent plastic material in a cast.

The alignment of the disclosed packaging is achieved using the precision alignment mechanism extended outward from the leadframe while combining the opto-electrical module with the optic fiber connector. The opto-electrical module is mounted on the circuit board through the pins of the leadframe.

Furthermore, the invention directly forms a lens on the transparent plastic base to replace the additional converging lens in the prior art.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

The disclosed opto-electrical module packaging structure contains: an opto-electric module and a transparent plastic base. The opto-electrical module consists of a leadframe installed with more than one opto-electrical device. The leadframe has several pins that are mounted on a circuit board by soldering to provide electrical communications. The leadframe further has a precision alignment structure extending outward. The transparent plastic base is used to package the opto-electrical module. It is installed with a converging lens for focusing light. The converging lens is aligned with the opto-electrical devices using the precision packaging procedure of the leadframe, which could be chip mounting or chip bonding. The alignment design of using the leadframe in the invention and the molding packaging means can provide a low-cost and high-yield no-pin opto-electrical module packaging.

Figure 1A:
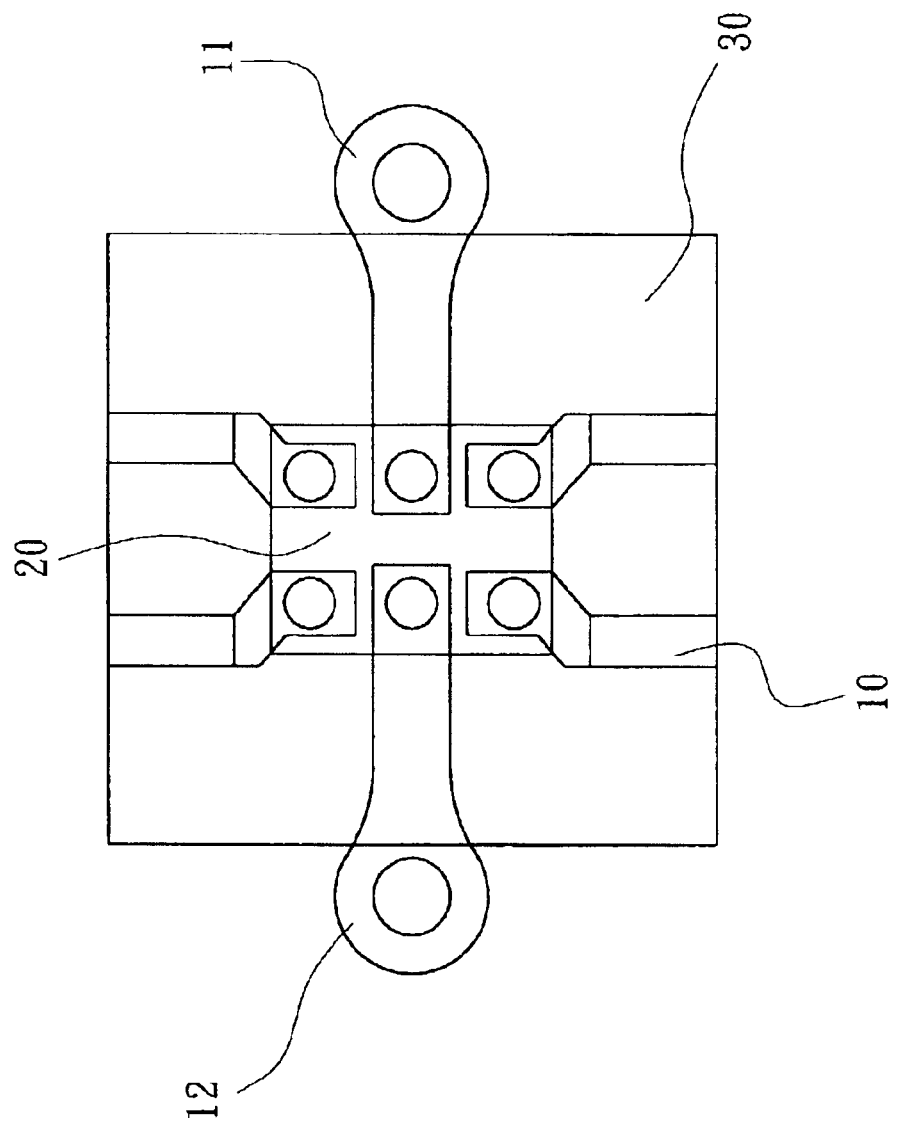
FIG. 1A is a top perspective view of the first embodiment of the invention.
Figure 1B:
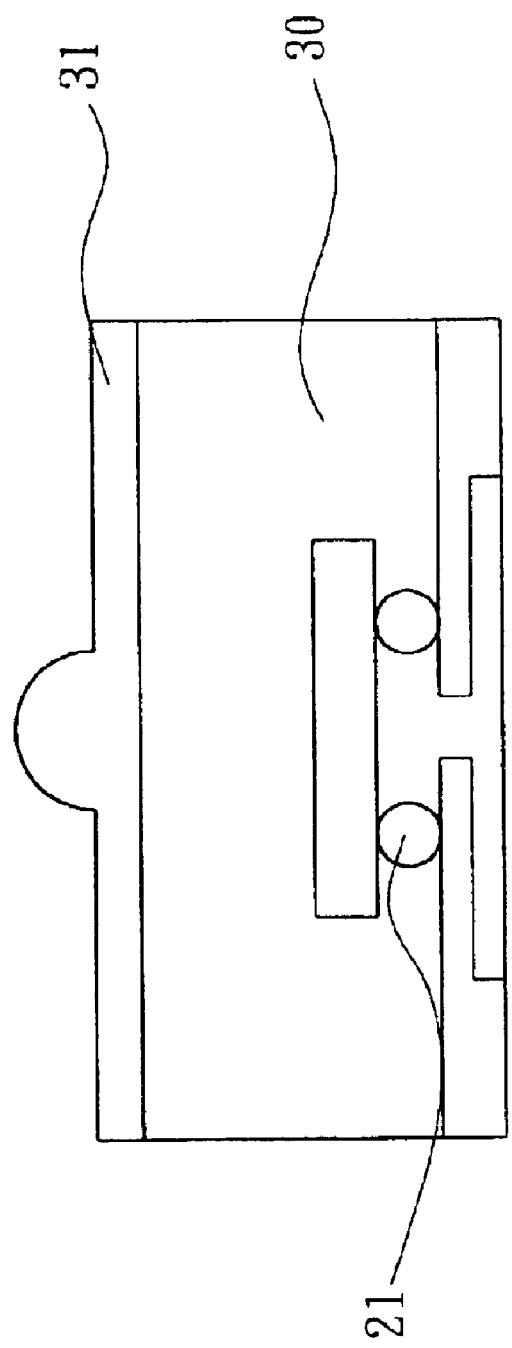
FIG. 1B is a side cross-sectional view of the first embodiment of the invention.
Figure 1C:
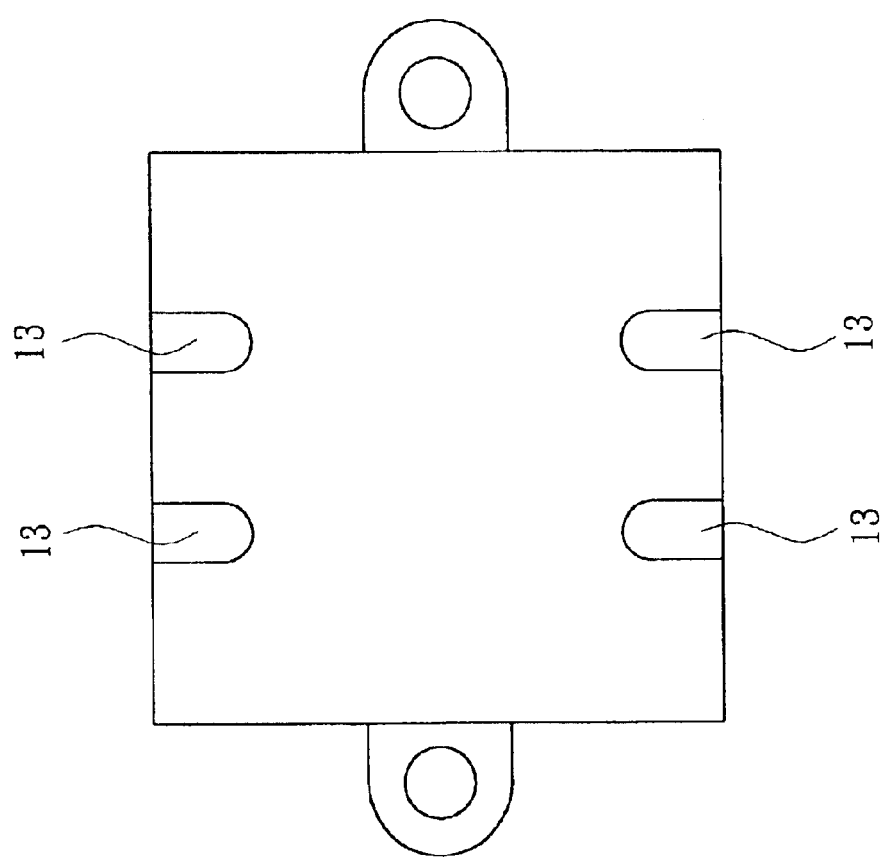
FIG. 1C is a schematic back view of the first embodiment of the invention.

A first embodiment of the invention is shown in FIGS. 1A through 1C. As shown in FIG. 1A, the leadframe 10 has positioning through holes 11, 12 extending outward. A vertical cavity surface emitting laser (VCSEL) 20 is installed on the leadframe 10 by chip mounting 21. A transparent plastic base 30 is then used to package the opto-electrical module.

With reference to FIG. 1B, one can clearly see that the disclosed opto-electrical transceiver module has a converging lens 31 installed on the transparent plastic base 30. The converging lens 31 is aligned using the positioning through holes (not shown) on the leadframe.

Please refer to FIG. 1C for the back structure of the disclosed opto-electrical module packaging. In the drawing, two pairs of pins 13 are displayed. The pins 13 are directly soldered to the circuit board for electrical signal communications using the surface mount technology. Since the pins are not exposed, the packaging volume can be reduced.

Figure 2:
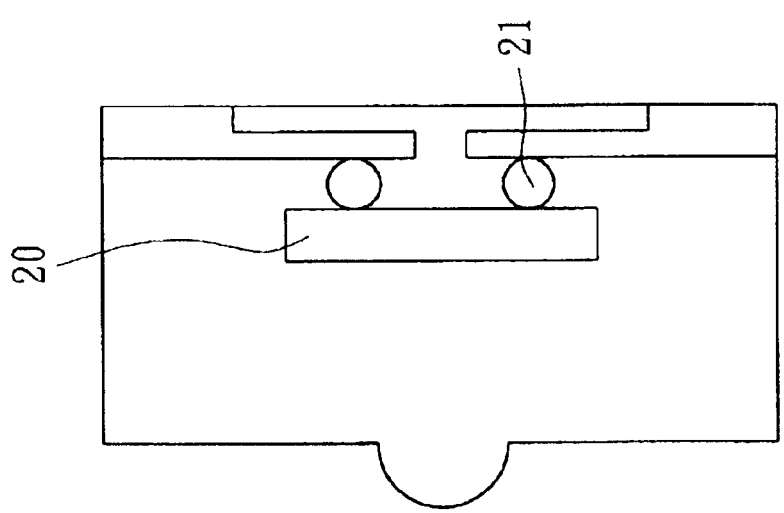
FIG. 2 is a side cross-sectional view of the second embodiment of the invention.

Another embodiment of the invention is shown in FIG. 2. In comparison with the first embodiment, the difference is in that a lens is directly formed on the transparent plastic base 30 in replacement of the converging lens.

Figure 3:
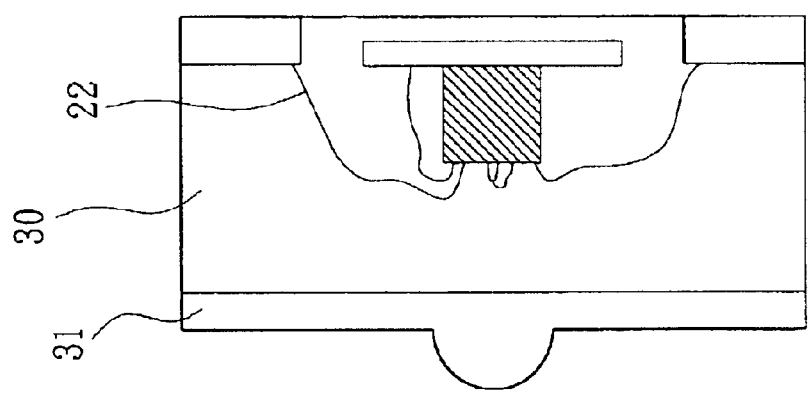
FIG. 3 is a side cross-sectional view of the third embodiment of the invention.

The opto-electrical devices in the disclosed opto-electrical module packaging can be combined with the leadframe by bonding or chip mounting, as shown in FIG. 3. The difference of it from the first embodiment is that the opto-electrical devices are connected to the leadframe by bonding 22.

Figure 4:
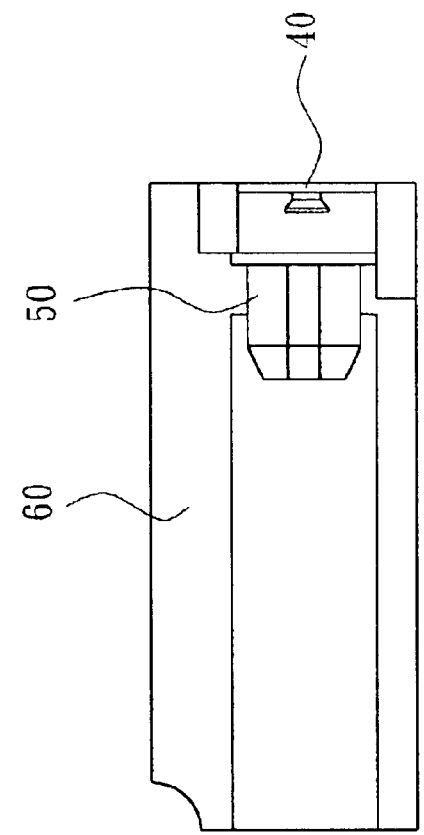
FIG. 4 is a schematic view of combining an optic fiber connector to the opto-electrical module according to the invention.
Figure 4:
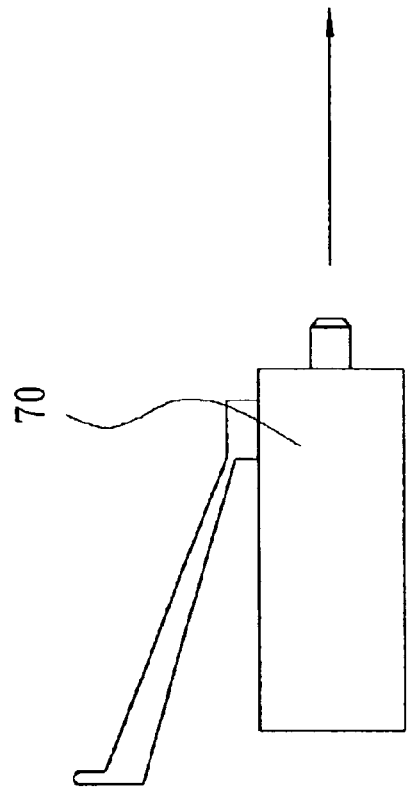

In the following, we use an embodiment for combining an optic fiber connector to the opto-electrical module to explain the alignment structure of the invention. With reference to FIG. 4, the opto-electrical module package 40 is installed within a metal cylinder 50. The metal cylinder 50 has a guiding pin for inserting into the positioning through hole extended outward from the leadframe. The metal cylinder 50 then combines with the optic fiber connecting device 60. Finally, the optic fiber connector 70 is inserted into the optic fiber connecting device 60 (FIG. 4). The position of the optic fiber is thus fixed, forming an aligned structure of the opto-electrical module and the optic fiber connector 70.

EFFECTS OF THE INVENTION

The invention uses the molding packaging means to increase the assembly density and yield while lowering the cost. The opto-electrical module packaging technique performs alignment using the precision alignment structure of the leadframe while combining with the optic fiber connector. The surface mount technology is further utilized to mount the opto-electrical module package directly on the circuit board. Through the self-alignment property of the chip mounting or the precision chip attachment in bonding, a passive alignment between the chip and the lens can be performed to increase the yield. Since the opto-electrical module package is directly mounted on the circuit board, the packaging has a reduced volume and no exposed pins.

Certain variations would be apparent to those skilled in the art, which variations are considered within the spirit and scope of the claimed invention.

What is claimed is:

1. An opto-electrical module package, which comprises:
   an opto-electrical module, which has a leadframe with a plurality of pins and installed with at least one opto-electrical device, the leadframe having a precision alignment structure as the alignment mechanism for aligning the opto-electrical module package with an optic fiber connector during assembly;
   a transparent plastic base, which is used to package the opto-electrical module and is installed with a convergent lens for focusing light, the converging lens using the precision alignment structure to align with the opto-electrical module; and
   a circuit board for the opto-electrical module to mount on via the pins by soldering.

2. The opto-electrical module package of claim 1, wherein the precision alignment structure is at least one pair of guiding holes extending outward.

3. The opto-electrical module package of claim 1, wherein the opto-electrical device is selected from the group consisting of a light-emitting device, a photo detector, an arrayed light-emitting device, and an arrayed photo detector.

4. The opto-electrical module package of claim 1, wherein the opto-electrical device is installed on the leadframe using a method selected from bonding and chip mounting.

5. The opto-electrical module package of claim 1, wherein the transparent plastic base is made of a light-transparent material.

6. An opto-electrical module package, which comprises:
   an opto-electrical module, which has a leadframe with a plurality of pins and installed with at least one opto-electrical device, the leadframe having a precision alignment structure as the alignment mechanism for aligning the opto-electrical module package with an optic fiber connector during assembly;
   a transparent plastic base, which is used to package the opto-electrical module and is formed with a lens for focusing light, the lens using the precision alignment structure to align with the opto-electrical module; and
   a circuit board for the opto-electrical module to mount on via the pins by soldering.

7. The opto-electrical module package of claim 6, wherein the precision alignment structure is at least one pair of guiding holes extending outward.

8. The opto-electrical module package of claim 6, wherein the opto-electrical device is selected from the group consisting of a light-emitting device, a photo detector, an arrayed light-emitting device, and an arrayed photo detector.

9. The opto-electrical module package of claim 6, wherein the opto-electrical device is installed on the leadframe using a method selected from bonding and chip mounting.

10. The opto-electrical module package of claim 6, wherein the transparent plastic base is made of a light-transparent plastic material.

11. The opto-electrical module package of claim 1, wherein the transparent plastic base and the lens are a one-piece structure.

12. The opto-electrical module package of claim 6, wherein the transparent plastic base and the lens are one-piece structure.

13. An opto-electrical module package, which comprises:
- an opto-electrical module, which has a leadframe with a plurality of pins and installed with at least one opto-electrical device, the leadframe having means for aligning the opto-electrical module package with an optic fiber connector during assembly, the means including a precision alignment structure as the alignment mechanism;
- a transparent plastic base, which is used to package the opto-electrical module and is installed with a convergent lens for focusing light, the converging lens using the precision alignment structure to align with the opto-electrical module; and
- a circuit board for the opto-electrical module to mount on via the pins by soldering.

14. The opto-electrical module package of claim 13, wherein the precision alignment structure is at least one pair of guiding holes extending outward.

15. The opto-electrical module package of claim 13, wherein the opto-electrical device is selected from the group consisting of a light-emitting device, a photo detector, an arrayed light-emitting device, and an arrayed photo detector.

16. The opto-electrical module package of claim 13, wherein the opto-electrical device is installed on the leadframe using a method selected from bonding and chip mounting.

17. The opto-electrical module package of claim 13, wherein the transparent plastic base is made of a light-transparent material.

18. The opto-electrical module package of claim 13, wherein the transparent plastic base and the lens are a one-piece structure.

* * * * *